United States Patent
Bran

(10) Patent No.: US 7,268,469 B2
(45) Date of Patent: Sep. 11, 2007

(54) TRANSDUCER ASSEMBLY FOR MEGASONIC PROCESSING OF AN ARTICLE AND APPARATUS UTILIZING THE SAME

(75) Inventor: Mario E. Bran, Garden Grove, CA (US)

(73) Assignee: Akrion Technologies, Inc., Wilmington, DE (US)

( * ) Notice: Subject to any disclaimer, the term of this patent is extended or adjusted under 35 U.S.C. 154(b) by 0 days.

(21) Appl. No.: 11/375,907

(22) Filed: Mar. 15, 2006

(65) Prior Publication Data

US 2006/0180186 A1    Aug. 17, 2006

Related U.S. Application Data

(60) Continuation of application No. 10/726,774, filed on Dec. 3, 2003, now Pat. No. 7,117,876, which is a division of application No. 10/243,463, filed on Sep. 12, 2002, now Pat. No. 6,681,782, which is a continuation of application No. 09/953,504, filed on Sep. 13, 2001, now Pat. No. 6,463,938, which is a continuation of application No. 09/643,328, filed on Aug. 22, 2000, now Pat. No. 6,295,999, which is a continuation of application No. 09/057,182, filed on Apr. 8, 1998, now Pat. No. 6,140,744, which is a continuation-in-part of application No. 08/724,518, filed on Sep. 30, 1996, now Pat. No. 6,039,059.

(51) Int. Cl.
*H01L 41/04* (2006.01)
*H01L 41/053* (2006.01)
*H01L 41/09* (2006.01)

(52) U.S. Cl. ............... 310/328; 310/321; 310/322; 310/334

(58) Field of Classification Search ............... 310/328, 310/311, 317, 321, 322, 323.01, 323.02, 323.18, 310/323.19, 325, 334; 134/1.3
See application file for complete search history.

(56) References Cited

U.S. PATENT DOCUMENTS 2,498,737 A    2/1950    Holden (Continued)

FOREIGN PATENT DOCUMENTS

DE    3212-916    10/1983

(Continued)

OTHER PUBLICATIONS

Stuart A. Hoenig, Cleaning Surfaces with Dry Ice, Compress Air Magazine: Aug. 1986, pp. 22-25.

(Continued)

*Primary Examiner*—Darren Schuberg
*Assistant Examiner*—Derek Rosenau
(74) *Attorney, Agent, or Firm*—Brian L. Belles; Wolf, Block, Schorr & Solis-Cohen

(57) ABSTRACT

A transducer assembly for the megasonic processing of an article and apparatus incorporating the same. The transducer assembly comprises a vibration transmitter having a portion configured to be positioned adjacent to and spaced from the surface of an article so that when fluid is applied to the surface of the article, a meniscus of the fluid forms between the surface of the article and the portion of the vibration transmitter. The transducer assembly also comprises a transducer coupled to the vibration transmitter, where the transducer can oscillate to propagate megasonic energy through the vibration transmitter and through the meniscus of the fluid. In one embodiment, the transducer is located within an enclosed space and at least one passageway is provided for flowing a gas in and/or out of the enclosed space. In an another embodiment, the portion of the vibration transmitter includes an elongated edge that is positioned close to and generally parallel to a surface of the article. In an apparatus incorporating the transducer assembly, a rotatable support is provided to support the article to be processed.

58 Claims, 11 Drawing Sheets

U.S. PATENT DOCUMENTS

| | | |
|---|---|---|
| 2,699,403 A | 1/1955 | Courts |
| 2,713,998 A | 7/1955 | Eicken |
| 2,738,173 A | 3/1956 | Massa |
| 2,760,501 A | 8/1956 | Gander |
| 2,802,476 A | 8/1957 | Kearney |
| 2,814,575 A | 11/1957 | Lange, Jr. |
| 2,934,661 A | 4/1960 | Chambers |
| 2,950,725 A | 8/1960 | Jacke et al. |
| 3,077,155 A | 2/1963 | Maddock et al. |
| 3,094,314 A | 6/1963 | Kearney et al. |
| 3,113,761 A | 12/1963 | Platzman |
| 3,114,654 A | 12/1963 | Nishiyama et al. |
| 3,373,752 A | 3/1968 | Inoue |
| 3,401,708 A | 9/1968 | Henes |
| 3,441,754 A | 4/1969 | Heny |
| 3,449,792 A | 6/1969 | Veith |
| 3,511,323 A | 5/1970 | Riley, Jr. |
| 3,596,883 A | 8/1971 | Brech |
| 3,676,963 A | 7/1972 | Rice et al. |
| 3,689,783 A * | 9/1972 | Williams .................... 310/325 |
| 3,694,675 A | 9/1972 | Loveday |
| 3,700,937 A | 10/1972 | Rissolo |
| 3,702,519 A | 11/1972 | Rice et al. |
| 3,845,332 A | 10/1974 | Last |
| 3,893,869 A | 7/1975 | Mayer |
| 3,900,162 A | 8/1975 | Titus |
| 3,937,990 A * | 2/1976 | Winston .................... 310/325 |
| 3,972,018 A | 7/1976 | Erickson |
| 3,973,760 A | 8/1976 | Browning |
| 4,027,686 A | 6/1977 | Shortes et al. |
| 4,038,786 A | 8/1977 | Fong |
| 4,062,238 A | 12/1977 | Hertzl |
| 4,064,885 A | 12/1977 | Dussault |
| 4,111,546 A | 9/1978 | Maret |
| 4,178,188 A | 12/1979 | Dussaault et al. |
| 4,183,011 A | 1/1980 | Massa |
| 4,187,868 A | 2/1980 | Rudolphi |
| 4,318,749 A | 3/1982 | Mayer |
| 4,326,553 A | 4/1982 | Hall |
| 4,373,944 A | 2/1983 | Glick et al. |
| 4,389,820 A | 6/1983 | Fong et al. |
| 4,401,131 A | 8/1983 | Lawson |
| 4,402,458 A | 9/1983 | Lierke et al. |
| 4,461,651 A | 7/1984 | Hall |
| 4,489,740 A | 12/1984 | Rattan et al. |
| 4,501,285 A | 2/1985 | Irwin et al. |
| 4,537,511 A | 8/1985 | Frei |
| 4,543,130 A | 9/1985 | Schwartzman |
| 4,565,942 A | 1/1986 | Sakai et al. |
| 4,579,000 A | 4/1986 | Sudo |
| 4,591,485 A | 5/1986 | Olsen et al. |
| 4,631,250 A | 12/1986 | Hayashi |
| 4,635,655 A | 1/1987 | Daley et al. |
| 4,655,847 A | 4/1987 | Ichinoseki |
| 4,691,725 A | 9/1987 | Parisi |
| 4,694,527 A | 9/1987 | Yoshizawa |
| 4,744,181 A | 5/1988 | Moore et al. |
| 4,747,421 A | 5/1988 | Havashi |
| 4,804,007 A | 2/1989 | Bran |
| 4,805,171 A | 2/1989 | Whitlock et al. |
| 4,823,041 A | 4/1989 | Inoue et al. |
| 4,857,113 A | 8/1989 | Hodge |
| 4,863,561 A | 9/1989 | Freeman et al. |
| 4,869,278 A | 9/1989 | Bran |
| 4,902,350 A | 2/1990 | Steck |
| 4,917,123 A | 4/1990 | McConnell et al. |
| 4,932,168 A | 6/1990 | Tada et al. |
| 4,936,922 A | 6/1990 | Cherry |
| 4,971,920 A | 11/1990 | Miyashita et al. |
| 4,974,375 A | 12/1990 | Tada et al. |
| 4,978,067 A | 12/1990 | Berger et al. |
| 4,980,300 A | 12/1990 | Miyashita et al. |
| 4,984,597 A | 1/1991 | McConnell et al. |
| 4,997,490 A | 3/1991 | Vetter et al. |
| 4,998,549 A | 3/1991 | Bran |
| 5,001,084 A | 3/1991 | Kawai et al. |
| 5,013,366 A | 5/1991 | Jackson et al. |
| 5,016,055 A | 5/1991 | Pietrowski et al. |
| 5,017,236 A | 5/1991 | Moxness et al. |
| 5,025,597 A | 6/1991 | Tada et al. |
| 5,035,750 A | 7/1991 | Tada et al. |
| 5,037,481 A | 8/1991 | Bran |
| 5,062,898 A | 11/1991 | McDermott et al. |
| 5,071,776 A | 12/1991 | Matsushita et al. |
| 5,090,432 A | 2/1992 | Bran |
| 5,100,476 A | 3/1992 | Mase |
| 5,119,840 A | 6/1992 | Shibata |
| 5,125,979 A | 6/1992 | Swain et al. |
| 5,129,956 A | 7/1992 | Pickering et al. |
| 5,147,466 A | 9/1992 | Ohmor et al. |
| 5,247,954 A | 9/1993 | Grant et al. |
| 5,259,890 A | 11/1993 | Goff |
| 5,279,316 A | 1/1994 | Miranda |
| 5,286,657 A | 2/1994 | Bran |
| 5,316,591 A | 5/1994 | Chao et al. |
| 5,348,552 A | 9/1994 | Nakajima et al. |
| 5,355,048 A | 10/1994 | Estes |
| 5,364,474 A | 11/1994 | Williford, Jr. |
| 5,365,960 A | 11/1994 | Bran |
| 5,368,054 A | 11/1994 | Koretsky |
| 5,377,709 A | 1/1995 | Shibano |
| 5,534,076 A | 7/1996 | Bran |
| 5,560,362 A | 10/1996 | Sliwa, Jr. |
| 5,562,778 A | 10/1996 | Koretsky |
| 5,571,337 A | 11/1996 | Mohindra et al. |
| 5,625,249 A | 4/1997 | Grant |
| 5,721,463 A | 2/1998 | Snyder |
| 6,039,059 A | 3/2000 | Bran |
| 6,125,554 A | 10/2000 | Munakata et al. |
| 6,254,155 B1 | 7/2001 | Kassir |
| 6,295,999 B1 | 10/2001 | Bran |
| 6,463,938 B2 | 10/2002 | Bran |
| 6,488,040 B1 | 12/2002 | de Larios et al. |
| 6,742,279 B2 | 6/2004 | Lubomirsky |
| 6,823,880 B2 | 11/2004 | Sakashita |
| 6,907,890 B2 | 6/2005 | Myland |
| 2002/0098283 A1 | 7/2002 | Gurer et al. |

FOREIGN PATENT DOCUMENTS

| | | |
|---|---|---|
| DE | 4012467 | 10/1991 |
| EP | 0044800 | 1/1982 |
| EP | 319-806 | 6/1989 |
| EP | 0390134 | 3/1990 |
| EP | 658925 | 6/1995 |
| GB | 807023 | 1/1959 |
| GB | 1282552 | 7/1972 |
| GB | 1577384 | 10/1980 |
| JO | 06-112184 | 4/1994 |
| JP | 547874 | 1/1979 |
| JP | 54-69260 | 4/1979 |
| JP | 57-153638 | 9/1982 |
| JP | 57-178327 | 11/1982 |
| JP | 61-016528 | 6/1986 |
| JP | 61-240157 | 10/1986 |
| JP | 62-281431 | 12/1987 |
| JP | 63-36534 | 2/1988 |
| JP | 64-18229 | 1/1989 |
| JP | 01-246935 | 10/1989 |
| JP | 1-316935 | 10/1989 |
| JP | 1-304733 | 12/1989 |
| JP | 2-53185 | 4/1990 |
| JP | 02-252238 | 10/1990 |
| JP | 55-1114 | 3/1993 |

| | | |
|---|---|---|
| JP | 05-175184 | 7/1993 |
| JP | 05-347288 | 12/1993 |
| JP | 06-079245 | 3/1994 |
| JP | 7-24414 | 1/1995 |
| JP | 08-078368 | 3/1996 |
| WO | WO91/10566 | 7/1991 |

OTHER PUBLICATIONS

Va-Tran Systems. Inc.: Sno-Gun Dry Ice Snow Cleaning System for Electronic, Semicondustor, Medical, Optical and other Diverse Industries, no date information.

IBM Technical Disclosure Bulletin, Direct Cooling Technique for Quartz Deposition Montors, vol. 34, No. 7B, Dec. 1991.

CO2 Snow/Pellet Cleaning/Super Critical Fluid Precision Cleaning: Dec. 1995, vol. III. No. 11, p. 48.

Robert Sherman; John Grob and Walter Whitlock; Dry Surface Cleaning Using Co2 Snow: Journal of Vacuum Science & Technology B. Second Series, Vo. 9, No. 4, Jul./Aug. 1991, pp. 1970-1977.

Wayne T. McDermott, Richard C. Ockovic, Jin Jwang Wu and Robert J.Miller; Removing Submicron Surface Particles Using a Cryogenic Argon-Aerosol Technique: Microcontamination: Oct. 1991; pp. 33-36 and 94-95.

International Search Report for PCT Application No. PCT/US97/11812 dated Nov. 20, 1997. 10 MHz Ultrasonic Silicon Cleaning Tool, IBM Technical Disclosure Bulletin, vol. 37, No. 6A, p. 585,m Jun. 1, 1997.

* cited by examiner

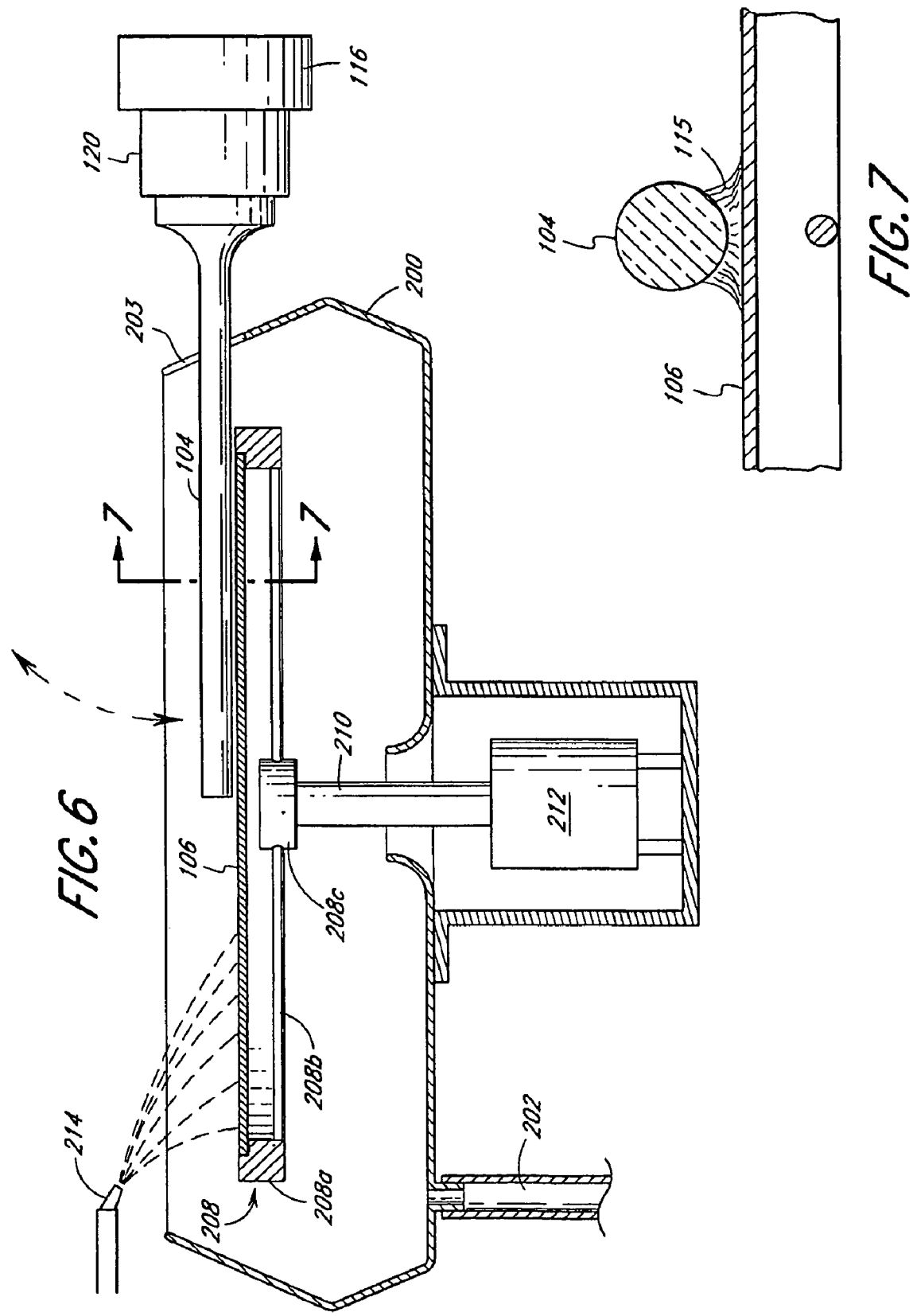

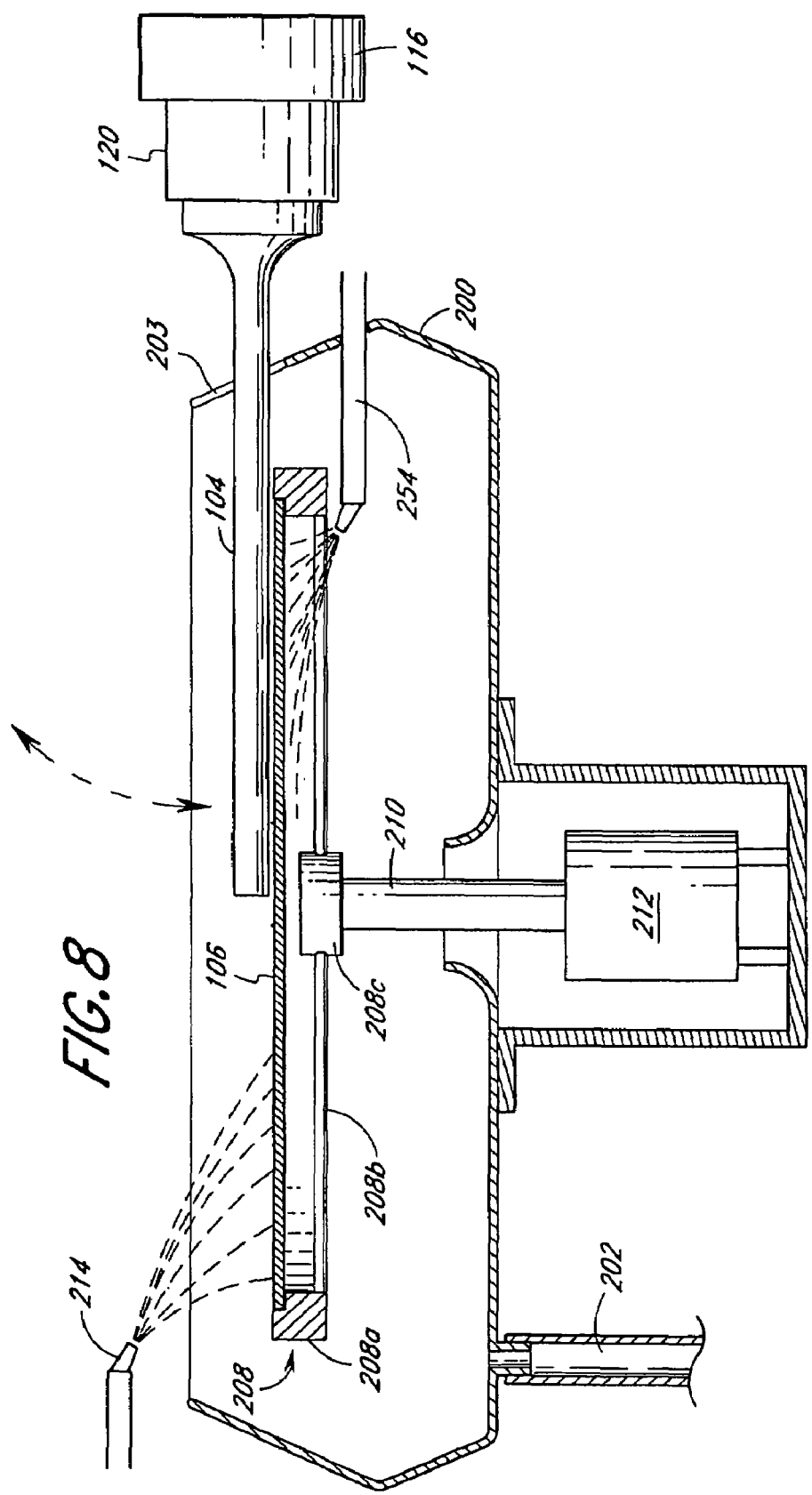

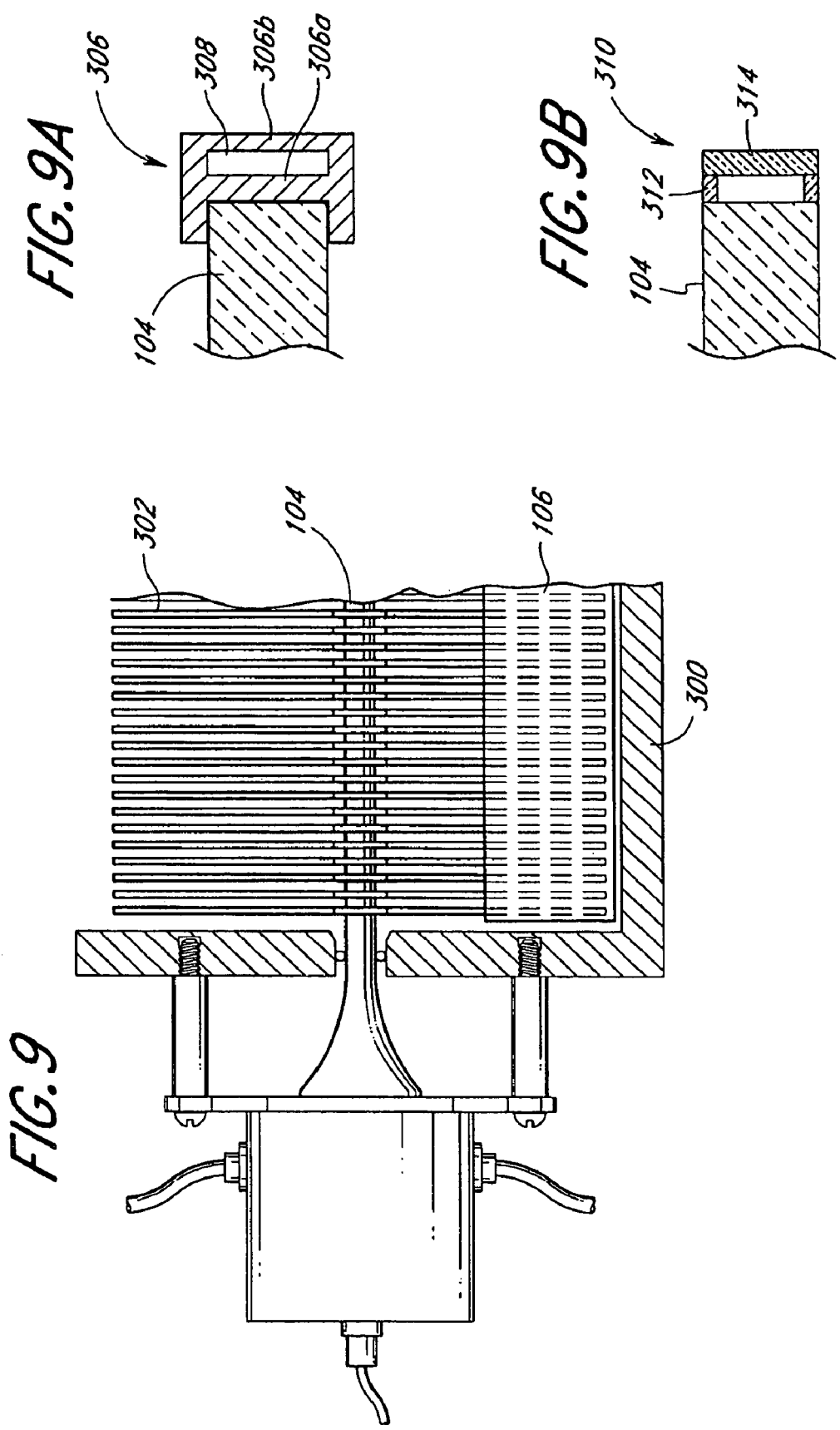

TRANSDUCER ASSEMBLY FOR MEGASONIC PROCESSING OF AN ARTICLE AND APPARATUS UTILIZING THE SAME

RELATED APPLICATIONS

This application is continuation of U.S. application Ser. No. 10/726,774, filed Dec. 3, 2003, now U.S. Pat. No. 7,117,876, which is a divisional of U.S. application Ser. No. 10/243,463, filed Sep. 12, 2002, now U.S. Pat. No. 6,681,782, which is a continuation of U.S. application Ser. No. 09/953,504, filed Sep. 13, 2001, now U.S. Pat. No. 6,463,938, issued Oct. 15, 2002, which is a continuation of U.S. application Ser. No. 09/643,328, filed Aug. 22, 2000, now U.S. Pat. No. 6,295,999, issued Oct. 2, 2001, which is a continuation of U.S. application Ser. No. 09/057,182, filed Apr. 8, 1998, now U.S. Pat. No. 6,140,744, issued Oct. 31, 2000, which is a continuation-in-part of U.S. application Ser. No. 08/724,518, filed Sep. 30, 1996, now U.S. Pat. No. 6,039,059, issued Mar. 21, 2000.

FIELD OF THE INVENTION

This invention relates to a transducer assembly for megasonic processing of an article requiring high levels of cleanliness.

BACKGROUND OF THE INVENTION

Semiconductor wafers are frequently cleaned in cleaning solution into which megasonic energy is propagated. Megasonic cleaning systems, which operate at a frequency over twenty times higher than ultrasonic, safely and effectively remove particles from materials without the negative side effects associated with ultrasonic cleaning.

Megasonic energy cleaning apparatuses typically comprise a piezoelectric transducer coupled to a transmitter. The transducer is electrically excited such that it vibrates, and the transmitter transmits high frequency energy into liquid in a processing tank. The agitation of the cleaning fluid produced by the megasonic energy loosens particles on the semiconductor wafers. Contaminants are thus vibrated away from the surfaces of the wafer. In one arrangement, fluid enters the wet processing container from the bottom of the tank and overflows the container at the top. Contaminants may thus be removed from the tank through the overflow of the fluid and by quickly dumping the fluid.

A gas impingement and suction cleaning process for electrostatographic reproducing apparatuses which utilizes ultrasonic energy and air under pressure is disclosed in U.S. Pat. No. 4,111,546, issued to Maret.

A process for cleaning by cavitation in liquefied gas is disclosed in U.S. Pat. No. 5,316,591, issued to Chao et al. Undesired material is removed from a substrate by introducing a liquefied gas into a cleaning chamber and exposing the liquefied gas to cavitation-producing means. The shape of the horn to provide the cavitation is not disclosed in detail and does not concentrate the sonic agitation to a particular location within the cleaning vessel.

In U.S. Pat. No. 4,537,511, issued to Frei, an elongated metal tube in a tank of cleaning fluid is energized in the longitudinal wave mode by a transducer that extends through a wall of the tank and is attached to the end of the tube. In order to compensate for relatively high internal losses, the radiating arrangement uses a relatively thin-walled tubular member.

A need exists for an improved apparatus and method which can be used to clean semiconductor wafers.

SUMMARY OF THE INVENTION

The above-referenced parent patent applications claims various forms of the invention. The present application is directed to additional embodiments of the invention.

It is therefore an object of the present invention to provide a transducer assembly for megasonic processing.

It is therefore another object of the present invention to provide a transducer assembly for megasonic processing of an article requiring extremely high levels of cleanliness.

These and other objects are met by the present invention, which in one aspect is a transducer assembly for megasonic processing of an article comprising a vibration transmitter including an elongated edge adapted to be positioned close to and generally parallel to a surface of the article so that when a fluid is applied to the surface of the article, a meniscus of the fluid is formed between the elongated edge and the surface of the article; and a transducer coupled to the transmitter, the transducer adapted to oscillate at a frequency for propagating megasonic energy through the transmitter and into the meniscus of the fluid.

In another aspect, the invention can be a transducer assembly for megasonic processing of an article comprising a vibration transmitter having a portion configured to be positioned adjacent a surface of an article, the vibration transmitter mounted to a structure so as to form an internal space; a transducer coupled to the vibration transmitter and adapted to oscillate at a frequency for propagating megasonic energy to vibrate the vibration transmitter so that when the portion of the vibration transmitter is fluidly coupled to a surface of an article to be cleaned, particles on the article are loosened, the transducer located within the internal space; and one or more openings in the structure for flowing gas into and/or out of the internal space in contact with the transducer.

In another aspect, the invention can be an apparatus for megasonic processing of an article comprising: a rotatable support for supporting an article; a vibration transmitter positioned so that a portion of the vibration transmitter is adjacent to and spaced from a surface of an article on the rotatable support so that when fluid is applied to the surface of the article, a film of the fluid couples the portion of the vibration transmitter to the surface of the article; a transducer coupled to the transmitter and adapted to oscillate at a frequency for propagating megasonic energy through the vibration transmitter and into the film of the fluid; the transducer located within an enclosed space; and at least one passageway into the enclosed space for flowing a gas into the enclosed space in contact with the transducer.

In one embodiment, the apparatus can further comprise a source of gas operably coupled to the at least one passageway. A conduit for applying the fluid to the surface of the article on the rotatable support can also be supplied. It may be preferable in some embodiments that the rotatable support support the article in a substantially horizontal orientation during rotation.

In still another embodiment, the transducer assembly can further comprise a heat transfer member positioned adjacent the transducer to transfer heat away from the transducer. The heat transfer member can be made of material which is a better heat conductor than the transmitter. Preferably, a transducer can comprise one or more piezoelectric transducers.

In yet another aspect, the invention can be an apparatus for sonic processing of an article comprising: a rotatable support for supporting an article in an substantially horizontal orientation; a vibration transmitter positioned so that a portion of the vibration transmitter is adjacent to and spaced from a surface of an article on the rotatable support so that when fluid is applied to the surface of the article, a meniscus of the fluid couples the portion of the vibration transmitter to the surface of the article; a transducer coupled to the vibration transmitter and adapted to oscillate at a frequency for propagating sonic energy through the vibration transmitter and into the meniscus of the fluid; an enclosure forming a space, the transducer located within the space; and one or more openings in the enclosure for flowing a gas into and/or out of the space.

In still another aspect, the invention can be an apparatus for megasonic processing of an article comprising: a rotatable support for supporting an article in a substantially horizontal orientation; a vibration transmitter positioned so that a portion of the vibration transmitter is adjacent to and spaced from a surface of an article on the rotatable support so that when fluid is applied to the surface of the article, a meniscus of the fluid couples the portion of the vibration transmitter to the surface of the article; a transducer coupled to the transmitter and adapted to oscillate at a frequency for propagating megasonic energy through the vibration transmitter and into the meniscus of the fluid; the vibration transmitter mounted to a structure so as to form an internal space, the transducer located within the internal space; and one or more openings in the structure for flowing a gas into and/or out of the space in contact with the transducer.

BRIEF DESCRIPTION OF THE DRAWINGS

FIG. 6 is a schematic view of the probe of the present invention used with cleaning fluid being sprayed onto the upper surface of a wafer.

FIG. 7 is a cross-sectional view on line 7-7 of FIG. 6.

FIG. 8 is a schematic view of the probe cleaning both surfaces of a wafer.

FIG. 9 is a schematic view of the probe of FIG. 1 extending through discs to be cleaned.

FIG. 9a is a fragmentary, cross sectional view of a cap for a probe tip.

FIG. 9b is a fragmentary, cross sectional view of another probe tip cap.

DETAILED DESCRIPTION OF THE PREFERRED EMBODIMENT

Figure 1:
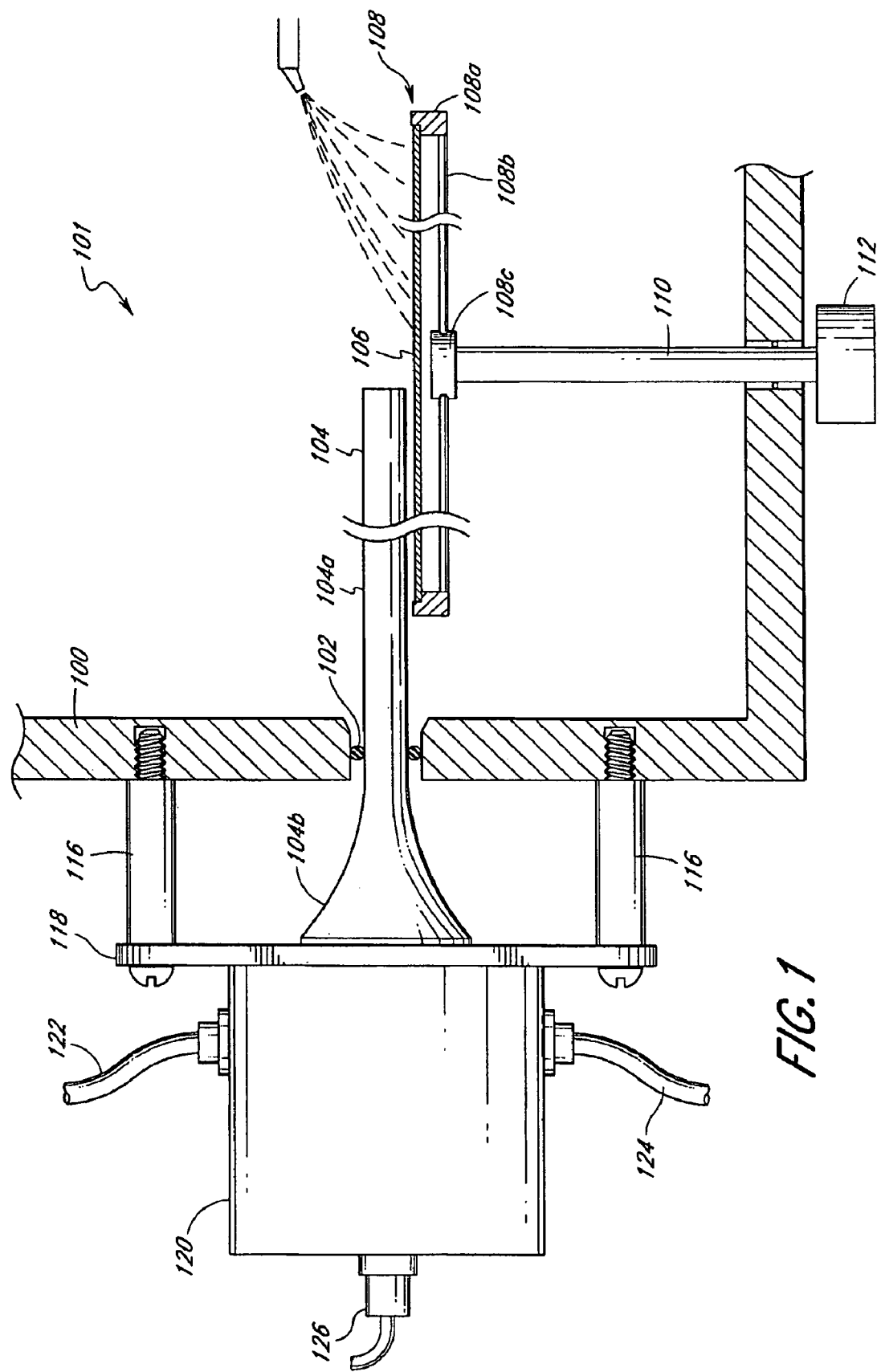
FIG. 1 is a side elevational view of one embodiment of the megasonic energy cleaning system of the present invention.
Figure 2:
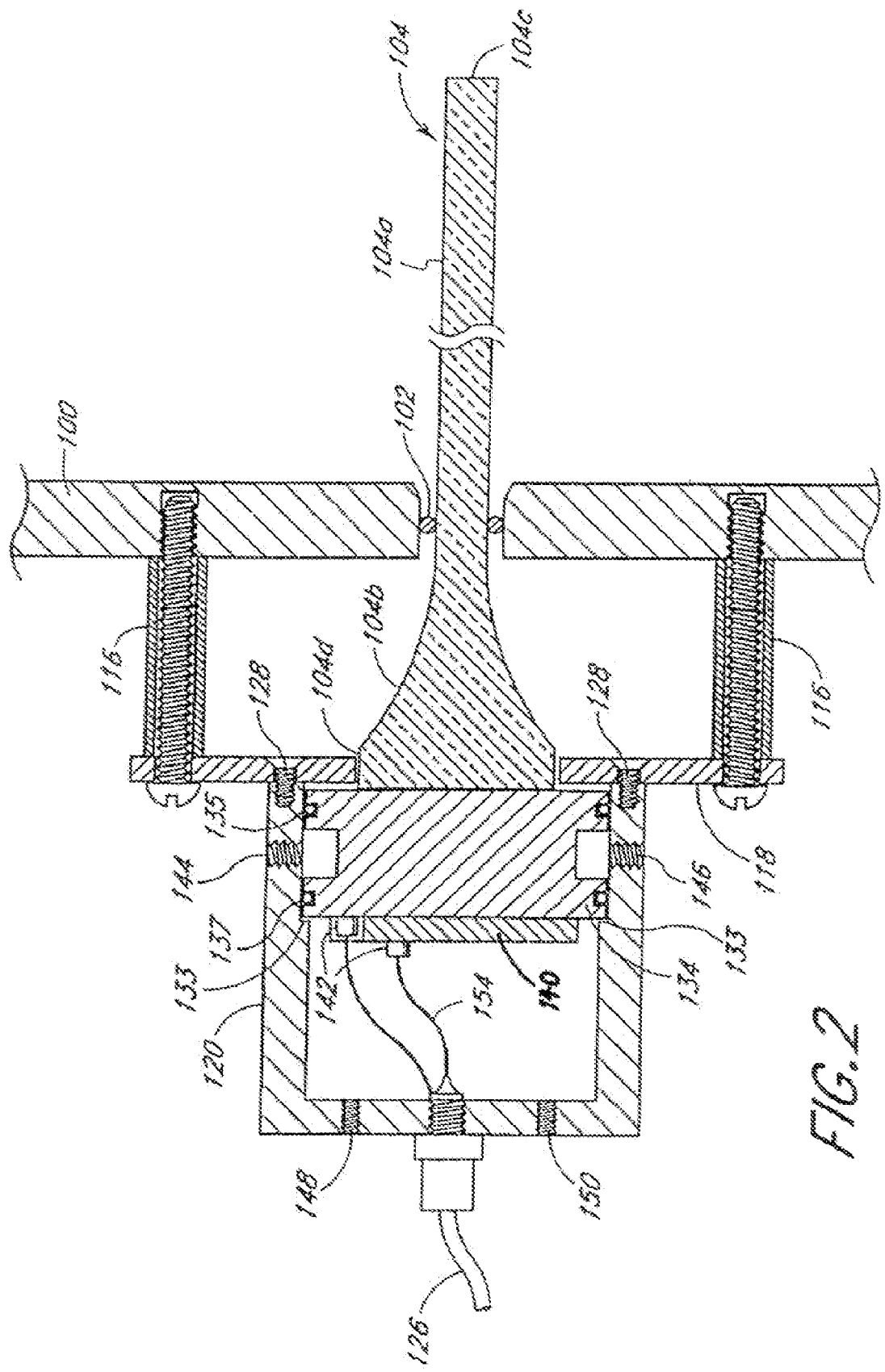
FIG. 2 is a side cross-sectional view of the system shown in FIG. 1.
Figure 3:
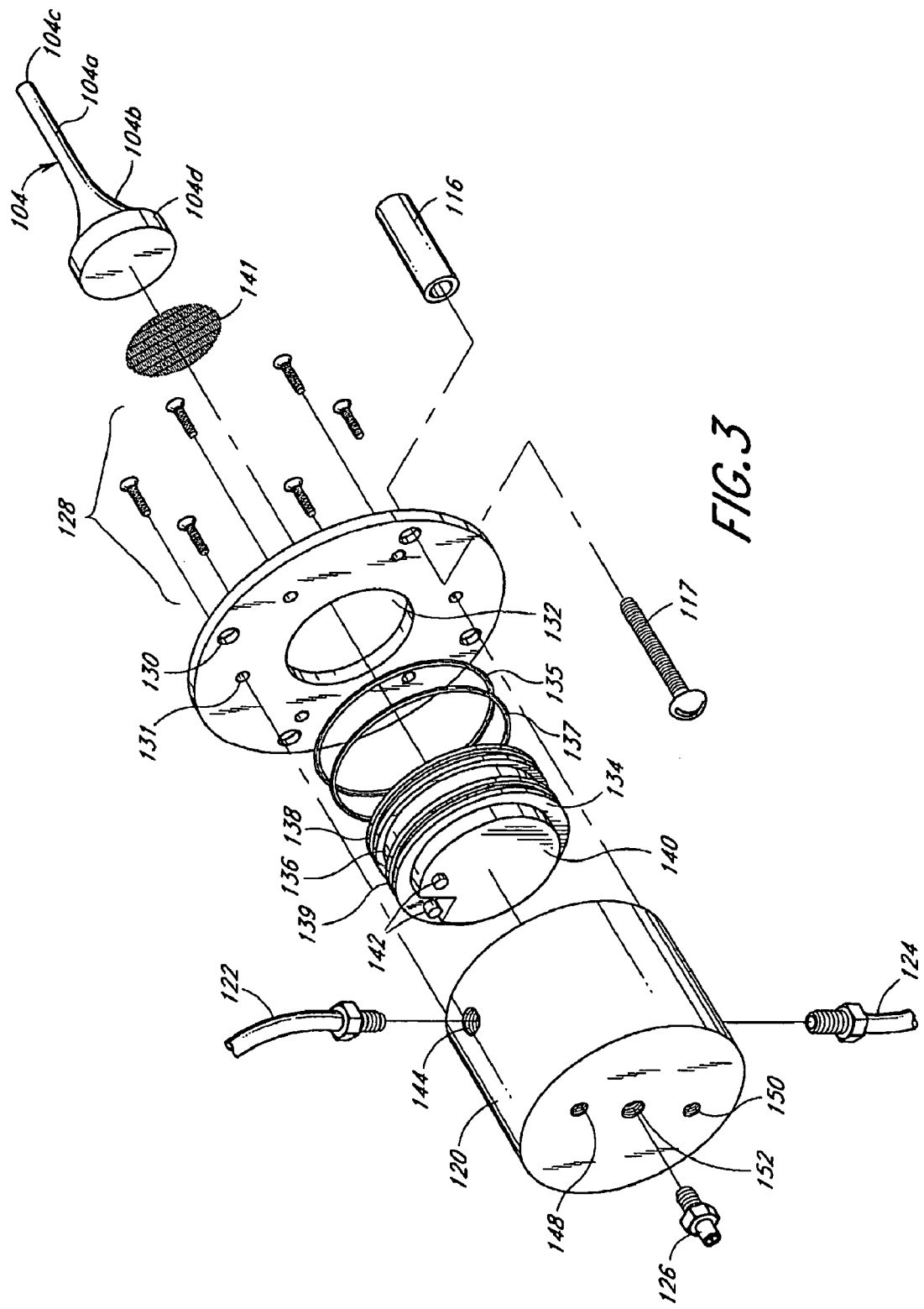
FIG. 3 is an exploded perspective view of the probe assembly shown in FIG. 1.

FIGS. 1-3 illustrate a megasonic energy cleaning apparatus made in accordance with the present invention with an elongated probe 104 inserted through the wall 100 of a processing tank 101. As seen, the probe is supported in cantilever fashion on one end exterior of the container. A suitable O-ring 102, sandwiched between the probe 104 and the tank wall, provides a proper seal for the processing tank 101. A heat transfer member 134, contained within a housing 120, is acoustically and mechanically coupled to the probe 104. Also contained within the housing 120 is a piezoelectric transducer 140 acoustically coupled to the heat transfer member 134. Electrical connectors 142, 154, and 126 are connected between the transducer 140 and a source of acoustic energy (not shown).

The housing supports an inlet conduit 124 and an outlet conduit 122 for coolant and has an opening 152 for electrical connectors. The housing is closed by an annular plate 118 with an opening 132 for the probe. The plate in turn is attached to the tank.

Within the processing tank 101, a support or susceptor 108 is positioned parallel to and in close proximity to the probe 104. The susceptor 108 may take various forms, the arrangement illustrated including an outer rim 108a supported by a plurality of spokes 108b connected to a hub 108c supported on a shaft 110, which extends through a bottom wall of the processing tank 101. Outside the tank 101, the shaft 110 is connected to a motor 112.

The elongated probe 104 is preferably made of a relatively inert, non-contaminating material, such as quartz, which efficiently transmits acoustic energy. While utilizing a quartz probe is satisfactory for most cleaning solutions, solutions containing hydrofluoric acid can etch quartz. Thus, a probe made of sapphire silicon carbide, boron nitride, vitreous carbon, glassy carbon coated graphite, or other suitable materials may be employed instead of quartz. Also, quartz may be coated by a material that can withstand HF such as silicon carbide or vitreous carbon.

The probe 104 comprises a solid, elongated, constant cross-section spindle-like or rod-like cleaning portion 104a, and a base or rear portion 104b. The cross-section of the probe is preferably round and advantageously, the diameter of the cleaning portion 104a of the probe 104 is smaller in diameter than the rear portion 104b of the probe 104. The tip of cleaning portion 104a terminates in a tip face/surface 104c. In a prototype arrangement the area of the rear face of the rear portion 104b is 25 times that of the tip face 104c of portion 104a. Of course, cross-sectional shapes other than circular may be employed.

A cylindrically-shaped rod portion 104a having a small diameter is desirable to concentrate the megasonic energy along the length of the rod 104a. The diameter of the probe, however, should be sufficient to withstand mechanical vibration produced by the megasonic energy transmitted by the probe. Preferably, the radius of the rod portion 104b should be equal to or smaller than the wavelength of the frequency of the energy applied to it. This structure produces a desired standing surface wave action which directs energy radially into liquid contacting the rod. In a prototype, the radius of the cylindrical portion of the probe contained within the tank was approximately 0.2 of an inch and operated at a wave length of about 0.28 of an inch. This produced 3 to 4 wave lengths per inch along the rod length and has provided good results.

The probe cleaning portion 104a should be long enough so that the entire surface area of the wafer is exposed to the probe during wafer cleaning. In a preferred embodiment, because the wafer is rotated beneath the probe, the length of the cleaning portion 104b should be long enough to reach at least the center of the wafer. Therefore, as the wafer is rotated beneath the probe, the entire surface area of the wafer is close to the probe. Actually, the probe could probably function satisfactorily even if it does not reach the center of the wafer since megasonic vibration from the probe tip would provide some agitation towards the wafer center.

The length of the probe is also determined by a predetermined number of wavelengths usually in increments of half wavelengths of the energy applied to the probe. In one embodiment, the length of the probe cleaning portion 104a equals nineteen wavelengths of the applied energy. Due to variations in transducers, it is necessary to tune the transducer to obtain the desired wavelength, so that it works at its most efficient point.

The rear probe portion 104b, which is positioned exterior the tank, flares to a diameter larger than the diameter of the cleaning portion 104a. In a first embodiment of the present invention, shown in FIGS. 1-3, the diameter of the cross-section of the rear portion of the probe gradually increases to a cylindrical section 104d. The large surface area at the end of the rear portion 104d is advantageous for transmitting a large amount of megasonic energy which is then concentrated in the smaller diameter section 104a.

Figure 4:
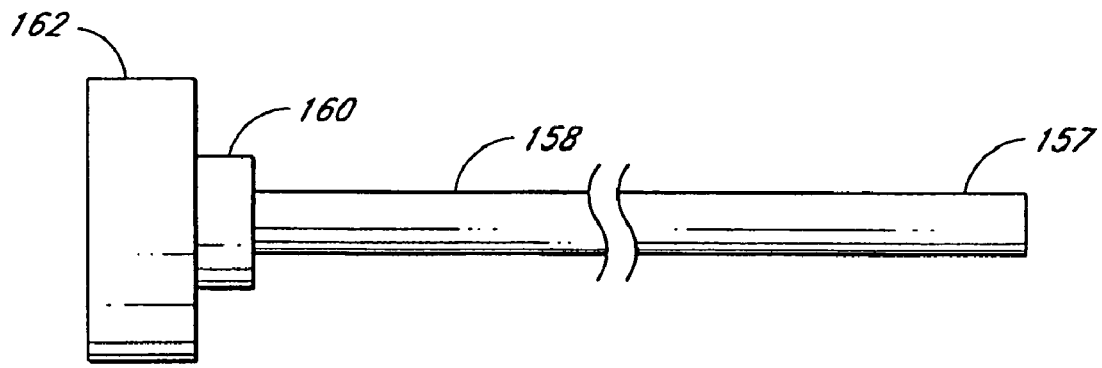
FIG. 4 is a side view of an alternative probe in accordance with the present invention.

As illustrated in FIG. 4, in an alternative embodiment of the present invention, the diameter of the cross-section of the rear portion of the probe increases in stepped increments, rather than gradually. The stepped increments occur at wavelength multiples to efficiently transmit the megasonic energy. For example, in one embodiment, the thinnest portion 158 of the probe has a length of approximately nineteen wavelengths, the next larger diameter portion 160 is about three wavelengths in axial length and the largest diameter portion 162 is about four wavelengths in axial length. The goal is to simulate the results obtained with the tapered arrangement of FIG. 1.

Figure 5A:
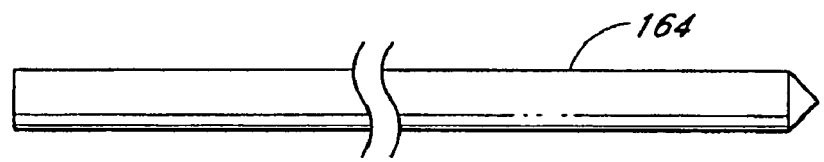
FIGS. 5a-5c are alternative probe tips which may be used in connection with the present invention.
Figure 5B:
Figure 5C:

FIGS. 5a-5c depict further embodiments for the tip of the probe. The different probe tips may help cover a portion of the wafer surface that otherwise would not be covered by a flat probe end 157. The probe may have a conical tip 164, an inverted conical tip 166, or a rounded tip 168.

The probe base 104d is acoustically coupled to a heat transfer member 134 and is physically supported by that member. The probe end face is preferably bonded or glued to the support by a suitable adhesive material. In addition to the bonding material, a thin metal screen 141, shown in FIG. 3, is sandwiched between the probe end and the member 134. The screen with its small holes filled with adhesive provides a more permanent vibration connection than that obtained with the adhesive by itself. The screen utilized in a prototype arrangement was of the expanded metal type, only about 0.002 inch thick with flattened strands defining pockets between strands capturing the adhesive. The adhesive employed was purchased from E. V. Roberts in Los Angeles and formed by a resin identified as number 5000, and a hardener identified as number 61. The screen material is sold by a U.S. company, Delkar. The probe can possibly be clamped or otherwise coupled to the heat transfer member so long as the probe is adequately physically supported and megasonic energy is efficiently transmitted to the probe.

As another alternative, the screen 141 may be made of a berylium copper, only about 0.001 inch thick, made by various companies using chemical milling-processes. One available screen holes for confining the resin that are larger than that of the Delkar.

The heat transfer member 134 is made of aluminum, or some other good conductor of heat and megasonic energy. In the arrangement illustrated, the heat transfer member is cylindrical and has an annular groove 136, which serves as a coolant duct large enough to provide an adequate amount of coolant to suitably cool the apparatus. Smaller annular grooves 138, 139 on both sides of the coolant groove 136 are fitted with suitable seals, such as O-rings 135, 137 to isolate the coolant and prevent it from interfering with the electrical connections to the transducer 140.

The transducer 140 is bonded, glued, or otherwise acoustically coupled to the rear flat surface of the heat transfer member 134. A suitable bonding material is that identified as ECF 550, available from Ablestick of Gardena, Calif. The transducer 140 is preferably disc shaped and has a diameter larger than the diameter of the rear end of the probe section 104d to maximize transfer of acoustic energy from the transducer to the probe. The heat transfer member is preferably gold-plated to prevent oxidizing of the aluminum and, hence, provide better bonding to the transducer and the probe. The member 134 should have an axial thickness that is approximately equal to an even number of wave lengths or half wave lengths of the energy to be applied to the probe.

The transducer 140 and the heat transfer member 134 are both contained within the housing 120 that is preferably cylindrical in shape. The heat transfer member is captured within an annular recess 133 in an inner wall of the housing 120.

The housing is preferably made of aluminum to facilitate heat transfer to the coolant. The housing has openings 144 and 146 for the outlet 122 and the inlet conduit 124 for the liquid coolant. On its closed end, the housing 134 has an opening 152 for the electrical connections 126 and 154. Openings 148, 150 allow a gaseous purge to enter and exit the housing 120.

An open end of the housing 120 is attached to the annular plate 118 having the central opening 132 through which extends the probe rear section 104d. The annular plate has an outer diameter extending beyond the housing 120 and has a plurality of holes organized in two rings through an inner ring of holes 131, a plurality of connectors 128, such as screws, extend to attach the plate 118 to the housing 120. The annular plate 118 is mounted to the tank wall 100 by a plurality of threaded fasteners 117 that extend through the outer ring of plate holes 130 and thread into the tank wall 100. The fasteners also extend through sleeves or spacers 116 that space the plate 118 from the tank wall. The spacers position the transducer and flared rear portion 104b of the probe outside the tank so that only the cleaning portion of the probe and the probe tip extend into the tank. Also, the spacers isolate the plate 118 and the housing from the tank somewhat, so that vibration from the heat transfer member, the housing and the plate to the wall is minimized.

The processing tank 101 is made of material that does not contaminate the wafer. The tank should have an inlet (not shown) for introducing fluid into the tank and an outlet (not shown) to carry away particles removed from the article.

As the size of semiconductor wafers increases, rather than cleaning a cassette of wafers at once, it is more practical and less expensive to use a cleaning apparatus and method that cleans a single wafer at a time. Advantageously, the size of the probe of the present invention may vary in length depending on the size of the wafer to be cleaned.

A semiconductor wafer 106 or other article to be cleaned is placed on the support 108 within the tank 101. The wafer is positioned sufficiently close to the probe so that the agitation of the fluid between the probe and the wafer loosens particles on the surface of the wafer. Preferably, the distance between the probe and surface of the wafer is no greater than about 0.1 of an inch.

The motor 112 rotates the support 108 beneath the probe 104 so that the entire upper surface of the article is sufficiently close to the vibrating probe 104 to remove particles from the surface of the article. To obtain the necessary relative movement between the probe and the wafer 106, an arrangement could be provided wherein the wafer is moved transversely beneath the probe. Also, an arrangement could be provided wherein the support 108 remains in place while a probe moves above the surface of the wafer 106.

When the piezoelectric transducer 140 is electrically excited, it vibrates at a high frequency. Preferably the transducer is energized at megasonic frequencies with the desired wattage consistent with the probe size length and work to be performed. The vibration is transmitted through the heat transfer member 134 and to the elongated probe 104. The probe 104 then transmits the high frequency energy into cleaning fluid between the probe and the wafer. One of the significant advantages of the arrangement is that the large rear portion of the probe can accommodate a large transducer, and the smaller forward probe portion concentrates the megasonic vibration into a small area so as to maximize particle loosening capability. Sufficient fluid substance between the probe and the wafer will effectively transmit the energy across the small gap between the probe and the wafer to produce the desired cleaning. As the surface area of the wafer 106 comes within close proximity to the probe 104, the agitation of the fluid between the probe 104 and the wafer 106 loosens particles on the semiconductor wafer 106. Contaminants are thus vibrated away from the surfaces of the wafer 106. The loosened particles may be carried away by a continued flow of fluid.

Applying significant wattage to the transducer 140 generates considerable heat, which could present damage to the transducer 140. Therefore, coolant is pumped through the housing 120 to cool the member 134 and, hence, the transducer.

A first coolant, preferably a liquid such as water, is introduced into one side of the housing 120, circulates around the heat transfer member 134 and exits the opposite end of the housing 120. Because the heat transfer member 134 is made of a good thermal conductor, significant quantities of heat may be easily conducted away by the liquid coolant. The rate of cooling can, of course, be readily monitored by changing the flow rate and/or temperature of the coolant.

A second, optional coolant circulates over the transducer by entering and exiting the housing 120 through openings 148, 150 on the closed end of the housing. Due to the presence of the transducer 140 and the electrical wiring 142, 154, an inert gas such as nitrogen is used as a coolant or as a purging gas in this portion of the housing.

Figure 11:
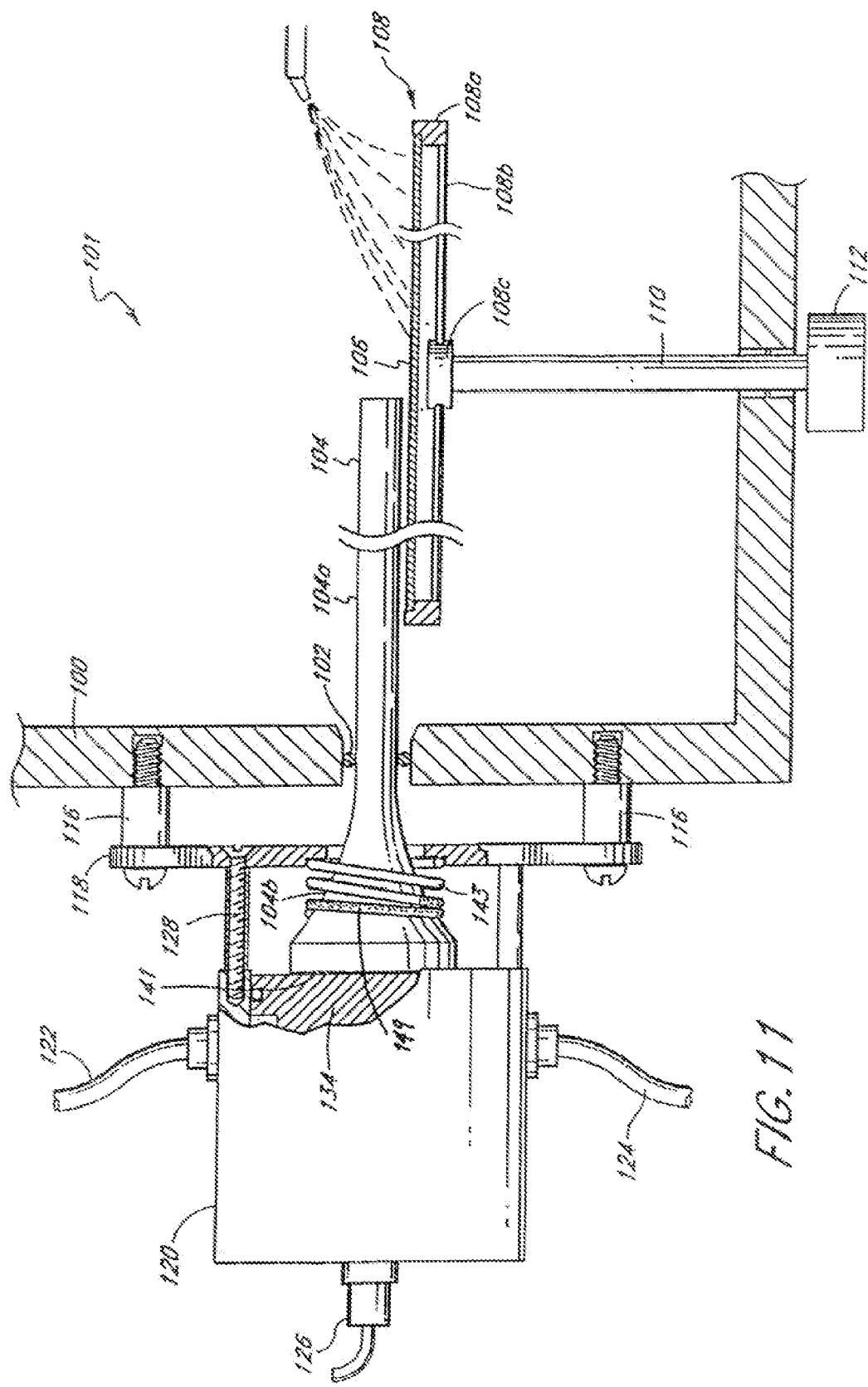
FIG. 11a side elevational, partially sectionalized view of another embodiment of the invention having an alternate means of coupling the probe to a support.

An alternative arrangement for coupling the probe end 104b to the member 134 is illustrated in FIG. 11. Instead of having the probe bonded to the member 134, a so-called vacuum grease is applied to the screen 141, and the probe is pressed against the member 134 by a coil spring 143. Vacuum grease is a viscous grease which can withstand pressures on opposite sides of a joint without leaking or being readily displaced. In a prototype arrangement, the combination of the grease and the metal spring provided a reliable acoustic coupling. As may be seen in FIG. 11, the housing 120 instead of being mounted directly to the plate 118, is mounted to the plate 118 by standoffs, which comprise the sleeves 116 and the fasteners 117. The sleeves 116 and the fasteners 117 are shorter than that shown in FIG. 2, such that the plate 118 surrounds the tapered portion of the probe. This leaves a gap between the housing 120 and the plate 118. The coil spring 143 is positioned in this gap and compressed between the plate 118 and the tapered portion of the probe. Thus, the spring presses the probe toward the member 134. This arrangement acoustically couples the probe to the heat transfer member 134. A Teflon sleeve 149 is preferably positioned over the first coil of the spring 143 adjacent the probe so that the metal spring does not damage the quartz probe.

An arrangement is illustrated in FIG. 6, wherein the probe assembly of FIG. 1 is shown in conjunction with a tank 200 which is open on its upper end and has a drain line 202 in its lower end. The probe 104 is shown extending through a slot 203 into the tank above a wafer 106 mounted on a suitable support 208 including an annular rim 208a, a plurality of spokes 208b, joined to a hub 208c positioned on the upper end of a shaft 210 rotated by a motor 212.

In use, deionized water or other cleaning solution is sprayed onto the upper surface of the wafer from a nozzle 214 while the probe 104 is being acoustically energized. The liquid creates a meniscus 115 between the lower portion of the probe and the adjacent upper surface of the rotating wafer. This is schematically illustrated in FIG. 7. The liquid provides a medium through which the megasonic energy is transmitted to the surface of the wafer to loosen particles. These loosened particles are flushed away by the continuously flowing spray and the rotating wafer. When the liquid flow is interrupted, a certain amount of drying action is obtained through centrifical force of the liquid off of the water.

The probe assembly may be conveniently mounted on a suitable support, schematically illustrated at 216. The support is capable of pivoting the assembly upwardly, as indicated by the arrow in FIG. 6, to facilitate the installation and removal of wafers. Alternatively, the slot 203 may instead be formed as a hole, closed at the top, and the probe may be moved radially in and out.

FIG. 8 illustrates an alternative or addition to the arrangement of FIG. 6 wherein both the lower and upper sides of a wafer are cleaned. A spray nozzle 254 extends through a side wall of a tank 200 and is angled upwardly slightly so that cleaning fluid may be sprayed between the spokes 208b and onto the lower surface of a wafer 106 and is directed radially inwardly so that as the wafer rotates, the entire lower surface is sprayed with the fluid. The wafer is subjected to megasonic energy by the probe 104 in the same manner as described above in connection with FIG. 6. This agitation vibrates the wafer as well as the fluid on the lower surface of the wafer which is radially aligned with the probe as the wafer rotates. This agitation loosens particles on the lower surface of the wafer, and the particles are flushed away with the fluid which falls or drips from the lower surface of the wafer.

Various fluids may be employed as the spray applied to the wafer in FIGS. 6 and 8. In addition to liquid or high pressure gas, so-called dry ice snow may be applied. Va-Tran Systems, Inc. of Chula Vista, Calif. markets a product under the trademark SNO GUN for producing and applying such material. A major advantage of that approach is that there is no disposal problem after cleaning. Contamination is carried away from the clean surface in a stream of inert, harmless vapor. Disposal costs of cleaning media are eliminated. Advertising literature regarding the SNO GUN product states that cleaning with dry ice snow removes particles more thoroughly than blowing with dry nitrogen. It is said that the device removes even sub-micron particles as tiny as 0.2 microns, which are difficult or impossible to remove with a nitrogen jet. Such technology is further described in U.S. Pat. No. 5,364,474, which is incorporated herein by reference.

Referring to FIG. 9, the probe assembly of FIG. 1 is shown mounted to a wall of a tank 300. The probe 104 extends generally horizontally through central openings in a plurality of vertically orientated substrates such as "compact discs" 302. The discs may be mounted in a cassette immersed in the tank with the holes in the discs aligned with the probe. The cassette carrying the discs can then be moved laterally so that the probe extends through the holes in the discs, without actually contacting the discs. The tank is filled with liquid, such as deionized water to completely cover the discs. The probe is then vibrated by megasonic energy in the manner described above in connection with FIG. 1. The agitation produced by the probe is transmitted into the cleaning liquid between the discs to loosen particles on the surfaces of the discs. The energy propagates radially outward from the probe such that both sides of each disc are exposed to such energy. Cleaning liquid may be introduced into the container in continuous flow and allowed to overflow the upper end of the container to carry away loosened particles.

Because some megasonic energy will be transmitted through the end of the probe with the probe tip immersed in the liquid, a small cap 306 is positioned on the tip of the probe with the cap containing an air space 308 between two glass walls 306a and 306b, as shown in FIG. 9a. Since megasonic energy does not travel through ambient air to any significant degree, the cap prevents the loss of energy through the end of the probe. An alternative cap 310 shown in FIG. 9b employs a short section of glass tubing 212 attached to the end of the probe. As seen, the outer diameter of the tube is equal to the outer diameter of the probe, and the outer end of the tube spaced from the probe is closed by a disc 314.

Figure 10:
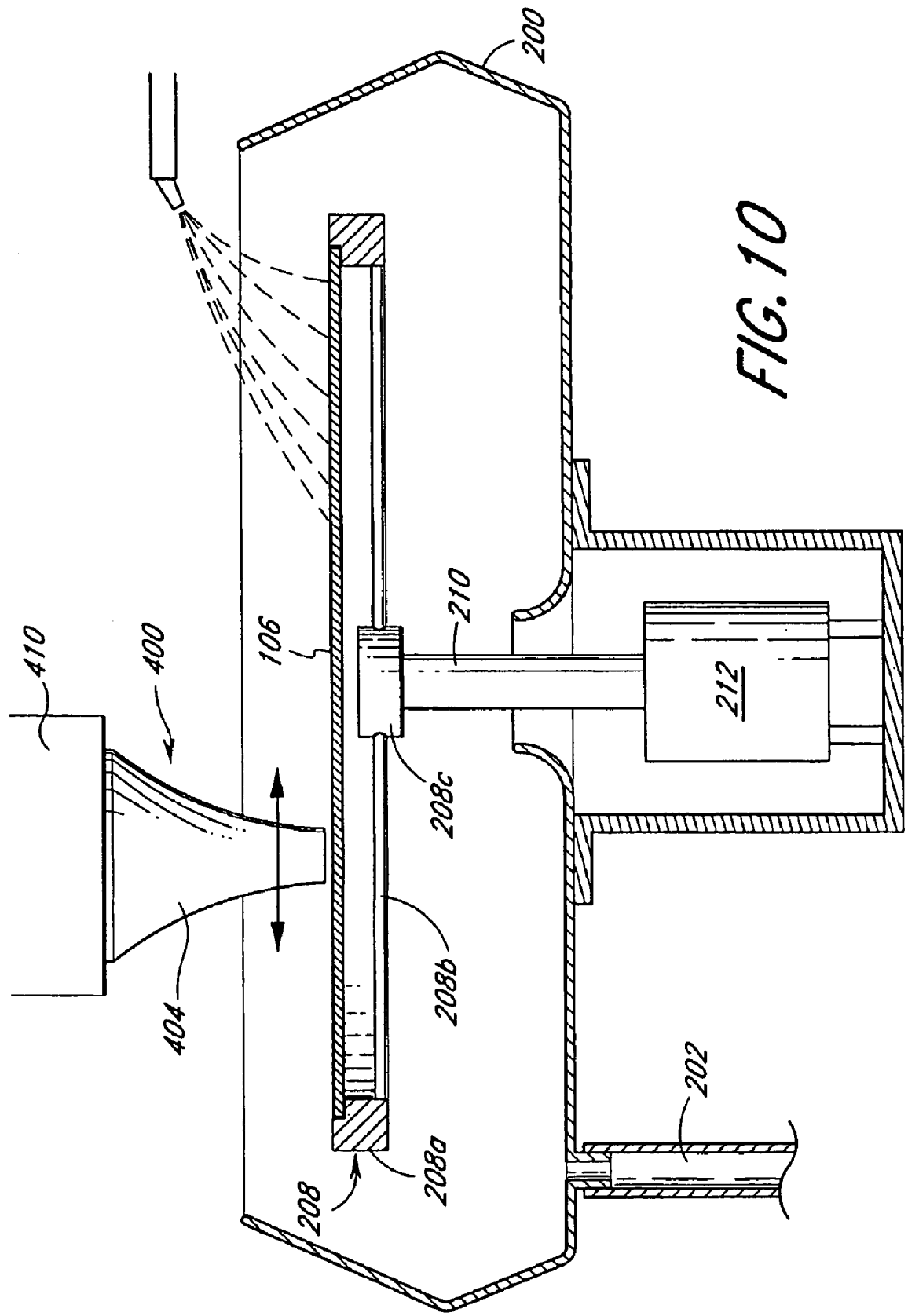
FIG. 10 is a schematic view of a probe vertically oriented with respect to a wafer.

FIG. 10 illustrates another embodiment of the probe of the invention. A probe assembly 400 is shown which is similar to the assembly of FIG. 1 except that the probe 404 is much shorter than the probe 104 in FIG. 1. In addition, the assembly 400 is oriented with the probe extending generally vertically, generally perpendicular to the surface of the horizontal wafer 106. Cleaning fluid is applied to the upper surface of the wafer, and the lower tip of the probe is in contact with this fluid. Consequently, megasonic energy is transmitted through this medium onto the surface of the wafer causing loosening of particles. Since the sides of the probe are not exposed to this medium, there is no appreciable megasonic energy transmitted from the vertical sides of the probe. Instead, such megasonic energy is concentrated into the tip. The tip can be moved radially with respect to the wafer as the wafer rotates so as to apply megasonic energy to the entire surface of the wafer. Alternatively, the probe may traverse the entire upper surface. Any suitable support 410 containing a mechanism to provide the desired movement may be employed.

As mentioned above, the preferred form of the probe assembly includes a probe made of inert material such as quartz and a heat transfer member coupled to the rear of the probe made of a good heat conducting material such as aluminum. Since it is the cylindrical portion of the probe which is in contact with the cleaning fluid and is positioned adjacent the wafer, an alternative arrangement could be devised wherein a forward portion, such as section 104a in FIG. 1 could be made of the inert material and the rear portion 104b could be made of aluminum and hence could be made as one piece with the heat transfer member 134. This of course means that the joint between the two components would be at the rear of the cylindrical portion 104a. While such a bonding area would not be as strong as the arrangement illustrated in FIG. 1, it may be useful in certain situations.

In the other direction, there may be some applications in which it is not necessary to employ quartz or other such inert material for the probe. Instead, the entire probe could be made of aluminum or other such material. In that situation, the heat transfer member could then be made as a one-piece unit with the probe. Also, with a metal probe it may be practical to spray the cleaning fluid through the probe itself. For example in the arrangement of FIG. 10, fluid inlet could be located in the side of the large diameter end of the probe and an outlet can be located in the end face of the small diameter probe end. The fluid would also serve as a coolant to cool the transducer, particularly if dry ice snow were employed.

Figure 12:
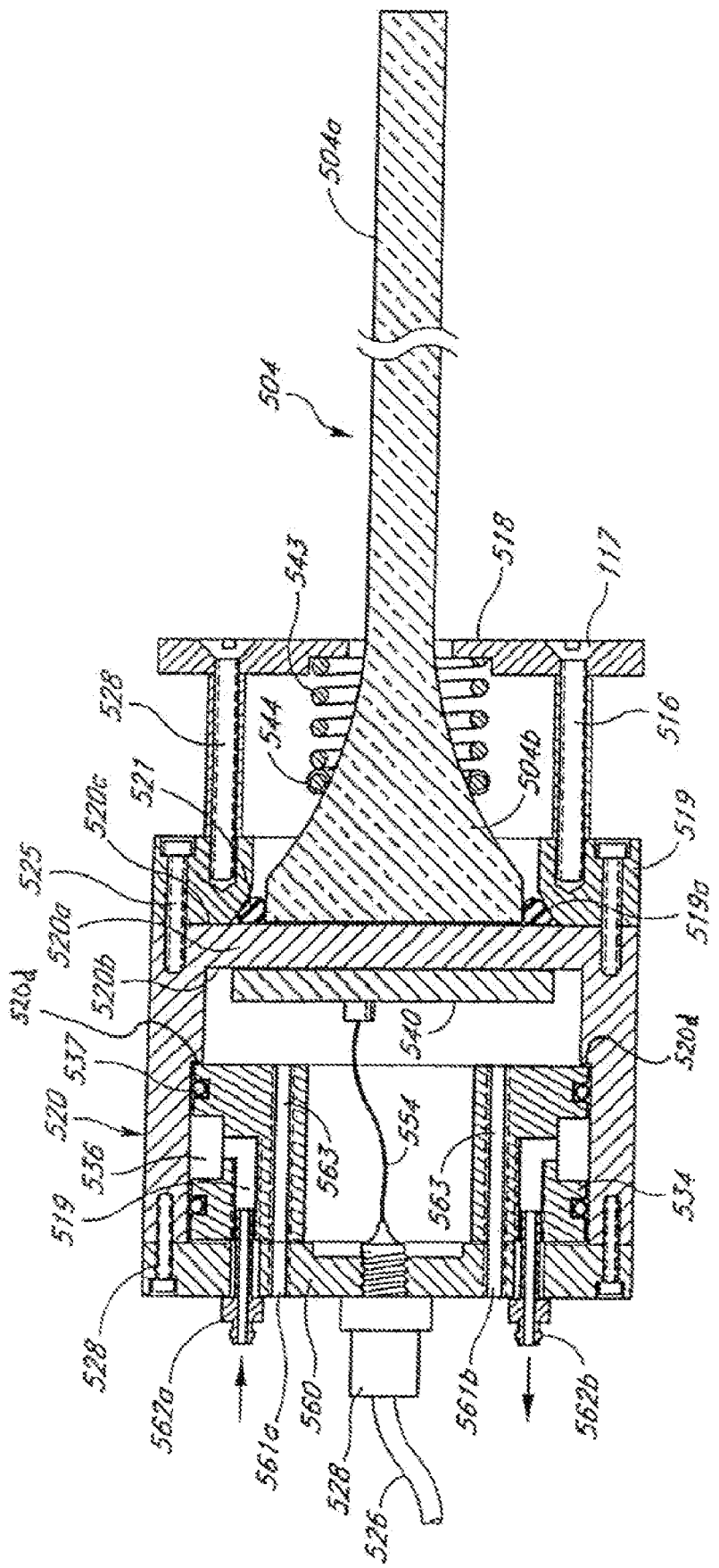
FIG. 12 is a side elevational, partially sectionalized view of another embodiment of the invention having an alternate means of mounting the probe to the housing.

The embodiment of FIG. 12 has a number of similarities to the other embodiments, but has some important distinctions. That arrangement includes a cup-shaped housing 520 similar to the housing 120 in FIG. 2, but inverted with respect to the housing 120. The housing 520 includes a closed end wall 520a having a surface 520b facing the interior of the housing 520 and having an exterior surface 520c facing away from the housing. Coupled to the interior end wall surface 520b is a disc-shaped transducer 540 analogous to the transducer 140 referred to above in connection with FIGS. 2 and 3. The transducer 540 is preferably bonded to the wall surface 520b in the same manner mentioned above in connection with FIGS. 2 and 3. The probe 504 comprises a solid elongated, constant cross-section spindle-like or rod-like cleaning portion 504a. The large end 504b of a probe 504 is acoustically coupled to the housing end wall exterior surface 520c. The acoustic coupling is accomplished by the use of a coil spring 543 surrounding the probe 504 and reacting against the spring retainer plate 518 to press the large end 504b of the probe towards the housing end wall 520a. As discussed in connection with FIG. 3, a screen 141, together with an appropriate viscous material, is sandwiched between the large end of the probe and the end wall 520a. The coil spring adjacent the large end of the probe has a sleeve or sleeve portions 544 made of a material which will not damage the probe. The O-ring 521 is held in place and compressed against the end wall 520a and the probe by a retainer ring 519 having a surface 519a which presses against the O-ring 521. The O-ring 521 thus prevents the escape of the viscous material from between the probe and the housing end wall, and centers the probe. The retainer ring is attached to the housing by a plurality of bolts 525 which extend through the retainer ring and thread into the housing. The spring 543 is captured and compressed by a reaction plate 518 which surrounds the probe and is attached to the housing by a plurality of fasteners 528 which thread into the retainer ring 519 and are spaced from it by sleeves 516 surrounding the fasteners 528. For convenience of illustration, the fasteners 525 and 528 are all shown in the same plane in FIG. 12. In actual practice, the fasteners 528 would preferably be on the same bolt hole diameter as the fasteners 525, and they of course would be spaced with respect to the fasteners 525. Also, the fasteners would not necessarily be spaced 180E apart as illustrated, but would be spaced in whatever manner is practical.

Positioned within the cup-shaped housing 520 is an annular heat transfer member 534 which has an external diameter sized to fit snugly within the housing 520. An annular groove 536 in the exterior of the heat transfer member 534, creates a liquid cooling channel in combination with the inner surface of the housing 520. A pair of O-rings 537 that fit within annular grooves in the heat transfer member seal the coolant channel 536 so that the remainder of the interior of the housing is sealed from the liquid. This prevents interference with the electrical energy being supplied to the transducer. Further, transducer vibration energy is not dissipated into the interior of the housing, but instead is transmitted into the housing end wall 520*a* and into the probe 504. The heat transfer member 534 is axially captured within the housing by means of an annular shoulder 520*d* and by a housing end plate 560. A plurality of fasteners 528 connect the plate 560 to the housing. A liquid coolant inlet 562*a* is mounted in an opening in the end plate 560 and threads into a passage 519 in the heat transfer member that extends axially and then radially into the annular channel 536. A similar outlet fitting 562*b* mounts in the end plate 560 diametrically opposed from the 562*a* fitting, and threads into another passage 519 that extends axially and radially into the channel 536.

A plurality of axially extending bores 563 are also formed in the heat transfer member 534, aligned with gas inlets 561*a, b* formed in the plate 560. The inlets 561*a, b* and bores 563 are shown in the same plane with the passages 519 for convenience. In actual practice, the bores 563 would preferably not be in the same plane as the passages 519, and instead would be circumferentially offset, and could also be formed in the same circle around the center of the heat transfer member 534. The inlets 561*a, b* through the end plate 560 for the fittings 562*a* and 562*b* would likewise be moved to be aligned with the passages 563.

The electrical connection for the transducer 540 is illustrated by the wire 554, although the more complete connection would be as shown in FIG. 3. That wire extends through a fitting 528 which in turn is connected to an electrical cord 526.

In operation, there are a number of advantages to the embodiment illustrated in FIG. 12. By coupling the transducer and the probe to the housing end wall, more energy may be transmitted to the probe than with the corresponding amount of power applied to the transducer in the arrangement of FIG. 2, inasmuch as the housing end wall has less mass than the mass of the heat transfer member 140 shown in FIG. 3. While some energy is lost into the other portions of the housing, there is a net increase in efficiency. The relatively thin end wall has fewer internal energy reflections than a thicker wall simply because of the reduced mass. However, in addition the housing end wall does not have the discontinuities caused by the grooves in the heat transfer member of FIG. 2, or by the O-ring in the grooves.

By making the housing 520 of aluminum or other material which is a relatively good thermal energy conductor, the heat generated by the transducer can be readily dissipated with the arrangement of FIG. 12. The heat transfer member 534 can be made of the desired axial length without concern for its mass because it is not to be vibrated as in the arrangement of FIG. 2. The cooling liquid enters through the fitting 562*a*, flows axially and then radially into the channel 536, where it splits into two branch flows in opposite directions, that meet on the other side of the heat transfer member and flow out the fitting 562*b*.

Similarly, cooling gas such as nitrogen can be connected to one or more of the bores 563 in the heat transfer member and into the central area of the housing. The gas is exhausted through one of the bores 563 leading to a second outlet 561*b*. Two passages 563 are illustrated in FIG. 12. Three are preferable, but more or less may be utilized if desired. To perform an additional function, bolts may be threaded into the bores 563 to assist in withdrawing the heat transfer member from the housing.

The assembly illustrated in FIG. 12 may be used in connection with a wall mounted arrangement such as that shown in FIG. 1, or may be used with a system such as that as illustrated in FIG. 8, wherein the probe assembly is moved into or out of position with respect to a wafer to facilitate insertion and removal of wafers. As mentioned above, such a probe may be moved out of the way by mounting it on a bracket that will pivot it in the direction of the arrow 218 shown in FIG. 8, or it may be on a track arrangement (not shown) which will move it radially inwardly and outwardly with respect to the wafer and its supporting member. The assembly of FIG. 12 may be mounted to these other structures in any suitable fashion, such as by making connections to the end plate 560.

Figure 13:
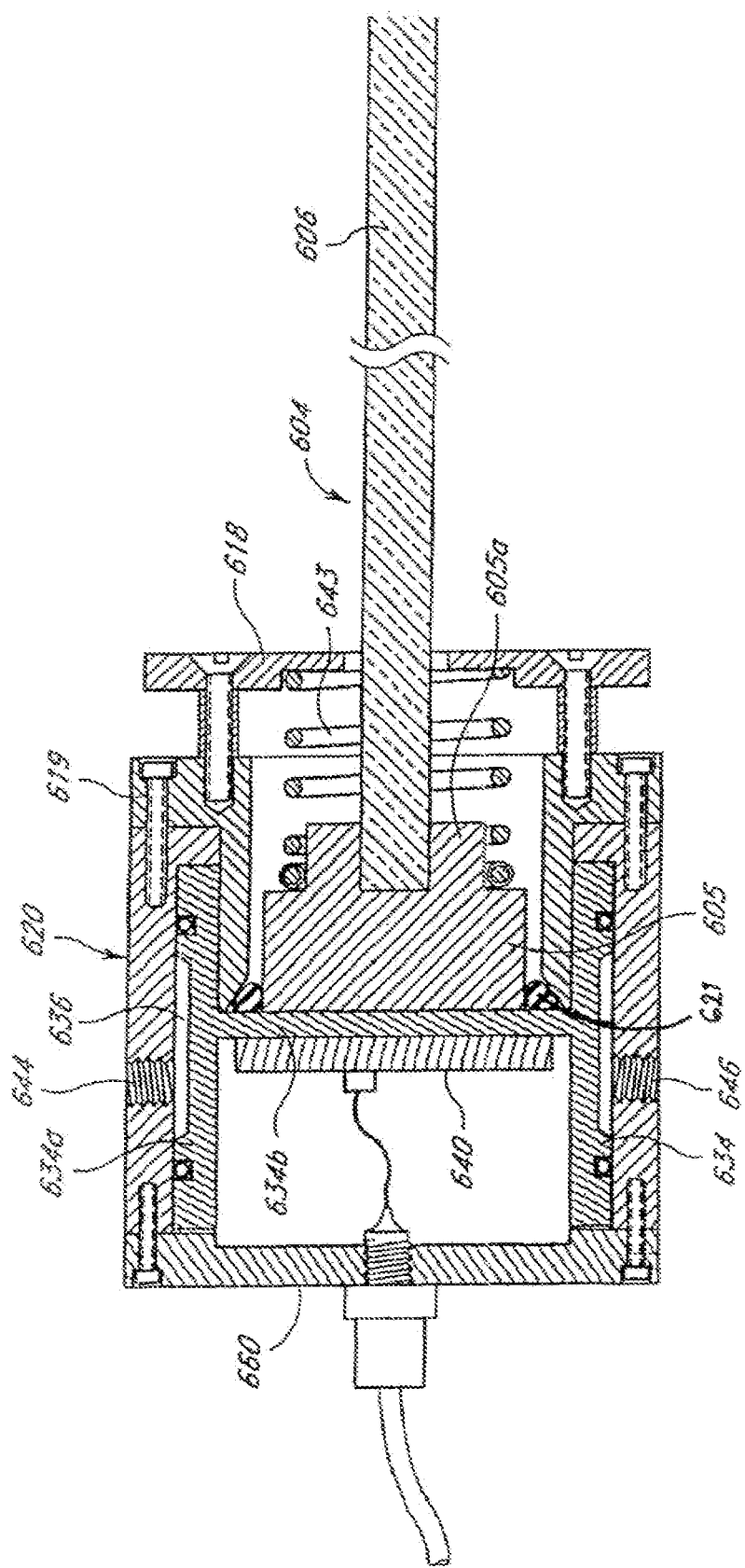
FIG. 13 is a side elevational, partially sectionalized view of another embodiment of the invention having an alternate arrangement for mounting the probe and an alternate probe construction.

The arrangement of FIG. 13 includes a generally tubular or cylindrical housing 620. Positioned within the housing is a heat transfer member 634 having an outer annular wall 634*a* which fits snugly within a surrounding annular wall of the housing 620. The heat transfer member 634 has an annular channel 636 formed in its outer surface that faces the surrounding housing wall to form a coolant passage. A coolant inlet 644 in the housing wall leads into the passage and an outlet 646 on the opposite side of the housing leads out of the passage.

As seen in FIG. 13, the heat transfer member 634 has somewhat of an H-shaped cross section created by a central disc-shaped wall 634*b* integrally formed with the surrounding annular wall 634*a*. As seen, the central wall 634*b* is relatively thin and it is radially aligned with the surrounding coolant passage 636. The heat transfer member is axially captured within the housing by an internal shoulder on one end of the housing and by an end plate 660 on the other end.

A piezoelectric transducer 640 is acoustically coupled to one side of the central wall 634*b*, such as in the same manner discussed above in connection with the other embodiments. A probe 604 is acoustically coupled to the other side of the central wall 634*b*. Again, this may be done in various ways, such as the screen and grease technique discussed above. An O-ring 621 surrounds the base of the probe and is compressed against the probe and the central wall 634*b* by a cylindrical portion of an end member 619 having a flange attached to the end of the housing 620. The O-ring confines the coupling grease and helps center the probe 604. The probe is pressed against the central wall 634*b* by a spring 643 compressed between an annular spring retainer plate 618 and the probe 604.

The housing and heat transfer member illustrated in FIG. 13 may be used with the probes illustrated in the above-mentioned embodiments, but it is illustrated in FIG. 13 with an alternate probe construction. Instead of having the probe made of one piece, it is formed in separate portions including a base 605 adjacent the central wall 634*b* of the heat transfer member, and an elongated cleaning rod 606. The base 605 has a cylindrical exterior with a reduced diameter portion 605*a* on the end spaced from the central wall 634*b*.

One end of the spring 643 surrounds the base portion 605a and engages the shoulder on the base 605 adjacent the portion 605a. The rod 606 of the probe fits within a central socket formed in the base 605. It is bonded to the base by a suitable adhesive which will not interfere with the transmission of the megasonic energy provided by the transducer 640 and propagated through the central wall 634b and the base 605 of the probe.

The base 605 can have a frusto-conical configuration just as the rear portion of the probe in FIG. 12, and the spring 643 could then engage the sloping side wall of such shape rather than having the step configuration shown in FIG. 13. Also, in theory, the rod 606 could have a tapered end and the spring could engage it as suggested by FIG. 12.

A primary purpose of having a probe made of two different portions is that one portion can be made of a different material from the other. For example, the base 605 can be utilized in any cleaning operation since it does not contact the cleaning solution; however, the rod 606 must be compatible with the cleaning solution. Thus, if the cleaning solution is compatible with quartz, a one-piece arrangement such as that illustrated in FIG. 1 or FIG. 12 could be conveniently utilized. If, however, the cleaning solution is not compatible with quartz, such as a solution containing hydrofluoric acid, a material for the rod is needed that is compatible, such as vitreous carbon, while the base can be quartz. It is currently difficult to obtain vitreous carbon in a shape such as that illustrated in FIG. 12. However, a straight cylindrical rod is more readily available. Hence, it is practical to utilize it in the arrangement illustrated in FIG. 13. Of course any other desirable combination of suitable materials for the rod and the base may be employed.

As mentioned above, the arrangement of FIG. 13 is particularly desirable from the standpoint that the transmission of megasonic energy is efficient through the thin wall portion of the heat exchange member, but yet the heat exchange process is very efficient. This is because the transducer, which is the heat generator, is in direct contact with the heat transfer member, which is in direct contact with the coolant passage 636. It should be recognized that other heat transfer arrangements may be employed. For example, if the heat transfer member has sufficient surface area, it might be possible to have it air-cooled rather than liquid-cooled. It should also be recognized that various other modifications of that type may be made to the embodiments illustrated without departing from the scope of the invention, and all such changes are intended to fall within the scope of the invention, as defined by the appended claims.

What is claimed is:

1. A transducer assembly for megasonic processing of an article comprising:
    a vibration transmitter including an elongated edge adapted to be positioned close to and generally parallel to a surface of the article so that when a fluid is applied to the surface of the article, a meniscus of the fluid is formed between the elongated edge and the surface of the article; and
    a transducer coupled to the transmitter, the transducer adapted to oscillate at a frequency for propagating megasonic energy through the transmitter and into the meniscus of the fluid.

2. The transducer assembly of claim 1 further comprising:
    a housing; and
    passageways through the housing for flowing a gas into and out of a space in the housing in contact with the transducer.

3. The transducer assembly of claim 1 further comprising:
    a housing mounted to the transmitter; and
    one or more threaded holes in the housing for mounting the transmitter in the close and generally parallel relation to the article.

4. The transducer assembly of claim 1 wherein the vibration transmitter is an elongated transmitter.

5. The transducer assembly of claim 4 wherein the vibration transmitter is a rod-like elongated transmitter.

6. The transducer assembly of claim 1 wherein the vibration transmitter is formed of quartz, sapphire, silicon carbide, silicon nitride, quartz coated with silicon carbide or quartz coated with vitreous carbon.

7. The transducer assembly of claim 1 further comprising means for supporting the transmitter in the close and generally parallel relation to the article in a cantilevered fashion.

8. The transducer assembly of claim 1 further comprising a heat transfer member positioned adjacent the transducer to transfer heat away from the transducer, the heat transfer member being made of material which is a better heat conductor than the transmitter.

9. The transducer assembly of claim 1 wherein the transducer comprises one or more piezoelectric transducers.

10. The transducer assembly of claim 1 further comprising:
    a housing forming a space and having an open end; and
    the transmitter mounted to the housing so as to enclose and protrude from the opening, the transducer being located within the space.

11. The transducer assembly of claim 1 further comprising means for connecting the transducer to a source of electrical energy.

12. The transducer assembly of claim 1 further comprising:
    a structure;
    the transmitter mounted to the structure so as to form an internal space, the transducer located within the internal space;
    passageways through the structure for flowing a gas into and out of the internal space in contact with the transducer;
    one or more threaded holes in the structure for mounting the transmitter in the close and generally parallel relation to the article;
    wherein the vibration transmitter is formed of quartz or sapphire; and
    wherein the transducer comprises one or more piezoelectric transducers.

13. The transducer assembly of claim 1 further comprising:
    a structure;
    the transmitter mounted to the structure so as to form an internal space, the transducer located within the internal space;
    passageways through the structure for flowing a gas into and out of the internal space in contact with the transducer, wherein one or more of the passageways are aligned with and oppose the transducer; and
    wherein the vibration transmitter is formed of quartz or sapphire.

14. The transducer assembly of claim 13 wherein the transmitter is an elongated transmitter.

15. The transducer assembly of claim 13 wherein the elongated edge is a substantially linear elongated edge.

16. An apparatus for megasonic processing of an article comprising:
    a rotatable support for supporting an article;

a vibration transmitter positioned so that a portion of the vibration transmitter is adjacent to and spaced from a surface of an article on the rotatable support so that when fluid is applied to the surface of the article, a film of the fluid couples the portion of the vibration transmitter to the surface of the article;

a transducer coupled to the transmitter and adapted to oscillate at a frequency for propagating megasonic energy through the vibration transmitter and into the film of the fluid;

the transducer located within an enclosed space; and at least one passageway into the enclosed space for flowing a gas into and/or out of the enclosed space in contact with the transducer.

17. The apparatus of claim 16 wherein the vibration transmitter is an elongated vibration transmitter.

18. The apparatus of claim 16 wherein the portion of the vibration transmitter comprises an elongated edge that extends substantially parallel to the surface of the article.

19. The apparatus of claim 16 wherein the vibration transmitter is constructed of quartz or sapphire.

20. The apparatus of claim 16 wherein the vibration transmitter overlays less than 100% of the surface of the article.

21. The apparatus of claim 16 wherein the enclosed space is formed by the vibration transmitter and a structural assembly.

22. The apparatus of claim 21 further comprising a heat transfer member positioned within the enclosed space between the transducer and the vibration transmitter, the heat transfer member being made of material which is a better heat conductor than the vibration transmitter.

23. The apparatus of claim 21 wherein the structural assembly comprises an opening, the vibration transmitter mounted so as to enclose the opening.

24. The apparatus of claim 23 wherein the structural assembly comprises the at least one passageway.

25. The apparatus of claim 24 wherein the at least one passageway and the opening are located on opposite sides of the enclosed space.

26. The apparatus of claim 16 wherein the enclosed space is formed by the vibration transmitter and a structural assembly having an opening; the vibration transmitter mounted so as to enclose the opening; and wherein the structural assembly comprises the at least one passageway.

27. The apparatus of claim 26 further comprising electrical connections extending through the structural assembly and operably connected to the transducer.

28. The apparatus of claim 27 wherein the electrical connections extend through the structural assembly on an opposite side of the enclosed space as the opening.

29. The apparatus of claim 17 wherein the rotatable support supports the article in a substantially horizontal orientation during rotation.

30. The apparatus of claim 16 further comprising a conduit for applying the fluid to the surface of the article on the rotatable support; and a source of the fluid operably coupled to the conduit.

31. The apparatus of claim 16 further comprising a source of gas operably coupled to the at least one passageway.

32. The apparatus of claim 31 wherein the gas is nitrogen.

33. The apparatus of claim 16 wherein the transducer includes a flat surface acoustically coupled to the vibration transmitter.

34. The apparatus of claim 16 wherein the vibration transmitter is a rod-like transmitter.

35. The apparatus of claim 16 wherein the transducer comprises one or more piezoelectric transducers.

36. The apparatus of claim 16 further comprising:

a source of gas operably coupled to the at least one passageway;

a conduit for applying the fluid to the surface of the article on the rotatable support;

a source of the fluid operably coupled to the conduit;

wherein the rotatable support supports the article in a substantially horizontal orientation during rotation;

wherein the portion of the vibration transmitter comprises an elongated edge that extends substantially parallel to the surface of the article;

wherein the vibration transmitter is constructed of quartz or sapphire;

wherein the vibration transmitter overlays less than 100% of the surface of the article;

wherein the enclosed space is formed by the vibration transmitter and a structural assembly having an opening, the vibration transmitter mounted so as to enclose the opening;

wherein the structural assembly comprises the at least one passageway, the passageway and the opening being located on opposite sides of the enclosed space;

electrical connections extending through the structural assembly and operably connected to the transducer; and wherein the transducer includes a flat surface acoustically coupled to the vibration transmitter.

37. The apparatus of claim 16 further comprising:

a source of gas operably coupled to the at least one passageway;

a conduit for applying the fluid to the surface of the article on the rotatable support;

a source of the fluid operably coupled to the conduit;

wherein the rotatable support supports the article in a substantially horizontal orientation during rotation;

wherein the vibration transmitter is constructed of quartz or sapphire;

wherein the vibration transmitter overlays less than 100% of the surface of the article;

wherein the enclosed space is formed by the vibration transmitter and a structural assembly having an opening, the vibration transmitter mounted to the structural assembly so as to enclose the opening;

wherein the structural assembly comprises the at least one passageway;

electrical connections extending through the structural assembly and operably connected to the transducer; and wherein the transducer includes a flat surface acoustically coupled to the vibration transmitter.

38. The apparatus of claim 16 wherein the enclosed space is formed by the vibration transmitter and a structure; wherein the structure comprises the at least one passageway; and wherein the at least one passageway is aligned with and opposes the transducer.

39. The apparatus of claim 38 wherein an unobstructed path exists through the enclosed space from the at least one passageway to the transducer so that the gas is introduced directly onto the transducer.

40. The apparatus of claim 38 wherein an unobstructed path exists through the enclosed space from the at least one passageway to the transducer; and wherein the at least one passageway is oriented so that the gas is introduced onto the transducer at a substantially normal angle.

41. The transducer assembly of claim 38 wherein the transmitter is an elongated transmitter.

42. The transducer assembly of claim 38 wherein the portion of the transmitter comprises a substantially linear edge.

43. An apparatus for sonic processing of an article comprising:
- a rotatable support for supporting an article in a substantially horizontal orientation;
- a vibration transmitter positioned so that a portion of the vibration transmitter is adjacent to and spaced from a surface of an article on the rotatable support so that when fluid is applied to the surface of the article, a meniscus of the fluid couples the portion of the vibration transmitter to the surface of the article;
- a transducer coupled to the vibration transmitter and adapted to oscillate at a frequency for propagating sonic energy through the vibration transmitter and into the meniscus of the fluid;
- an enclosure forming a space, the transducer located within the space; and
- one or more openings in the enclosure for flowing a gas into and/or out of the space.

44. The apparatus of claim 43 wherein the one or more openings are aligned with and oppose the transducer.

45. The apparatus of claim 44 wherein an unobstructed path exists through the space from the one or more openings to the transducer so that the gas is introduced directly onto the transducer.

46. The apparatus of claim 43 wherein an unobstructed path exists through the space from the one or more openings to the transducer; and wherein the one or more openings are positioned and oriented so that the gas in introduced onto the transducer at a substantially normal angle.

47. The apparatus of claim 43 wherein the portion of the transmitter comprises a substantially linear edge.

48. An apparatus for megasonic processing of an article comprising:
- a rotatable support for supporting an article in a substantially horizontal orientation;
- a vibration transmitter positioned so that a portion of the vibration transmitter is adjacent to and spaced from a surface of an article on the rotatable support so that when fluid is applied to the surface of the article, a meniscus of the fluid couples the portion of the vibration transmitter to the surface of the article;
- a transducer coupled to the transmitter and adapted to oscillate at a frequency for propagating megasonic energy through the vibration transmitter and into the meniscus of the fluid;
- the vibration transmitter mounted to a structure so as to form an internal space, the transducer located within the internal space; and
- one or more openings in the structure for flowing a gas into and/or out of the space in contact with the transducer.

49. The apparatus of claim 48 wherein the one or more openings are aligned with and oppose the transducer.

50. The apparatus of claim 49 wherein an unobstructed path exists through the space from the one or more openings to the transducer so that the gas is introduced directly onto the transducer.

51. The apparatus of claim 48 wherein an unobstructed path exists through the space from the one or more openings to the transducer; and wherein the one or more openings are positioned and oriented so that the gas is introduced onto the transducer at a substantially normal angle.

52. The apparatus of claim 48 wherein the portion of the transmitter comprises a substantially linear edge.

53. A transducer assembly for megasonic processing of an article comprising:
- a vibration transmitter having a portion configured to be positioned adjacent a surface of an article, the vibration transmitter mounted to a structure so as to form an internal space;
- a transducer coupled to the vibration transmitter and adapted to oscillate at a frequency for propagating megasonic energy to vibrate the vibration transmitter so that when the portion of the vibration transmitter is fluidly coupled to a surface of an article to be cleaned, particles on the article are loosened, the transducer located within the internal space; and
- one or more openings in the structure for flowing gas into and/or out of the internal space in contact with the transducer.

54. The apparatus of claim 53 further comprising:
- electrical connections extending through the structure and operably connected to the transducer;
- wherein the portion of the vibration transmitter comprises an elongated edge that extends substantially parallel to the surface of the article;
- wherein the vibration transmitter is constructed of quartz or sapphire;
- wherein the vibration transmitter overlays less than 100% of the surface of the article; and
- wherein the transducer includes a flat surface acoustically coupled to the vibration transmitter.

55. The transducer assembly 53 wherein the one or more openings are aligned with and oppose the transducer.

56. The transducer assembly of claim 55 wherein an unobstructed path exists through the internal space from the one or more openings to the transducer so that the gas is introduced directly onto the transducer.

57. The transducer assembly of claim 53 wherein an unobstructed path exists through the internal space from the one or more openings to the transducer; and wherein the one or more openings are positioned and oriented so that the gas is introduced onto the transducer at a substantially normal angle.

58. The transducer assembly of claim 53 wherein the portion of the transmitter comprises a substantially linear edge.

* * * * *

UNITED STATES PATENT AND TRADEMARK OFFICE
CERTIFICATE OF CORRECTION

PATENT NO. : 7,268,469 B2 Page 1 of 1
APPLICATION NO. : 11/375907
DATED : September 11, 2007
INVENTOR(S) : Mario B. Bran It is certified that error appears in the above-identified patent and that said Letters Patent is hereby corrected as shown below:

Column 10, line 26, after "having an" - please delete "open end"
Column 10, line 26 after "having an", please insert --opening--

Column 15, line 53, after "claim", please delete, "17"
Column 15, line 53, after "claim", please insert --16--

Signed and Sealed this

Twenty-seventh Day of November, 2007

JON W. DUDAS
*Director of the United States Patent and Trademark Office*